United States Patent [19]
Chen et al.

[11] Patent Number: 6,052,812
[45] Date of Patent: Apr. 18, 2000

[54] MESSAGING COMMUNICATION PROTOCOL

[75] Inventors: Zongbo Chen, Sunnyvale; Wade Langill; Richard W. Koralek, both of Palo Alto; Brian D. Korek, San Jose; Richard C. Beerman, Santa Clara, all of Calif.

[73] Assignee: PocketScience, Inc., Santa Clara, Calif.

[21] Appl. No.: 09/219,109

[22] Filed: Dec. 22, 1998

Related U.S. Application Data

[63] Continuation-in-part of application No. 09/003,203, Jan. 7, 1998.
[60] Provisional application No. 60/100,458, Sep. 15, 1998, and provisional application No. 60/102,834, Oct. 2, 1998.

[51] Int. Cl.[7] .............................. H03M 13/00; H04L 1/18
[52] U.S. Cl. ........................ 714/751; 714/748; 714/797
[58] Field of Search ................................. 714/748–751, 714/797; 370/311, 314, 319, 330, 331, 337, 346, 347, 349, 350, 468, 477, 508; 375/246; 379/358, 443, 444; 395/200.75; 340/825.44

[56] References Cited

U.S. PATENT DOCUMENTS

| | | | |
|---|---|---|---|
| 3,553,374 | 1/1971 | Wolf et al. ............................... | 379/443 |
| 3,978,407 | 8/1976 | Forney, Jr. et al. ..................... | 375/231 |
| 4,620,064 | 10/1986 | Kessler et al. ........................ | 379/93.37 |
| 4,669,090 | 5/1987 | Betts et al. .............................. | 375/222 |
| 4,862,461 | 8/1989 | Blaner .................................... | 714/749 |
| 4,903,261 | 2/1990 | Baran et al. ............................ | 370/396 |
| 5,175,817 | 12/1992 | Adams et al. .......................... | 709/236 |
| 5,485,464 | 1/1996 | Stodtbeck et al. ...................... | 370/319 |
| 5,515,385 | 5/1996 | Fulling et al. .......................... | 714/748 |
| 5,546,395 | 8/1996 | Sharma et al. .......................... | 370/468 |
| 5,629,940 | 5/1997 | Gaskill ................................... | 370/311 |
| 5,673,031 | 9/1997 | Meier ................................. | 340/825.08 |
| 5,751,702 | 5/1998 | Evans et al. ............................ | 370/314 |
| 5,790,804 | 8/1998 | Osborne ................................. | 709/245 |
| 5,923,650 | 7/1999 | Chen et al. ............................. | 370/331 |
| 5,930,233 | 7/1999 | Kanerva et al. ........................ | 370/231 |

OTHER PUBLICATIONS

*Newshound Email Comands*, Email commands and Description at http://www.hound.com/help/ecommandsdetails.htm.

*Primary Examiner*—Emmanuel L. Moise
*Attorney, Agent, or Firm*—Townsend and Townsend and Crew LLP; Kim Kanzaki

[57] ABSTRACT

The present invention uses an acoustic modem embedded in a remote device enhanced with automatic repeat request and forward error correction routines to provide reliable transfer of electronic messages from the messaging server to the remote device. This may provide significantly better error correction than standard PC modems. Also the present invention, may provide a fast, reliable connection sequence by use of a preamble frame. According to an embodiment of the present invention, a method of communicating messages between a messaging server and a remote device is provided. The method includes a variety of steps such as establishing a connection between the messaging server and the remote communication device by transmitting a preamble frame, exchanging data frames between the remote device and the messaging server, detecting and correcting errors in received frames, and re-transmitting received frames, if errors are uncorrectable.

24 Claims, 10 Drawing Sheets

MESSAGING COMMUNICATION PROTOCOL

CROSS-REFERENCES TO RELATED APPLICATIONS

This application claims priority from, and is a continuation-in-part of U.S. patent application Ser. No. 09/003,203, entitled "ELECTRONIC COMMUNICATIONS SYSTEM AND METHOD," filed Jan. 7, 1998, the disclosure of which is herein incorporated by reference for all purposes.

This application also claims priority from the following provisional patent applications, the disclosures of which are herein incorporated by reference for all purposes:

1. U.S. Provisional Patent Application Ser. No. 60/100,458, entitled "ELECTRONIC MESSAGING SYSTEM," filed Sep. 15, 1998; and
2. U.S. Provisional Patent Application Ser. No. 60/102,834, entitled "ELECTRONIC MESSAGING SYSTEM," filed Oct. 2, 1998.

The following applications, including this one, are being filed concurrently, and the disclosure of each other application is incorporated by reference into this application for all purposes:

1. U.S. patent application Ser. No. 09/219,228, entitled "SYSTEM AND METHOD FOR REMOTELY CONTROLLING MESSAGING SERVER FUNCTIONALITY";
2. U.S. patent application Ser. No. 09/218,973, entitled "SYSTEM AND METHOD FOR COMPRESSION AND DECOMPRESSION OF ELECTRONIC MAIL MESSAGES";
3. U.S. patent application Ser. No. 09/218,911, entitled "SYSTEM AND METHOD FOR COMMUNICATING ELECTRONIC MESSAGES OVER A TELEPHONE NETWORK USING ACOUSTICAL COUPLING"; and
4. U.S. patent application Ser. No. 09/218,932, entitled "SYSTEM AND METHOD FOR PROCESSING ELECTRONIC MAIL MESSAGES."
5. U.S. patent application Ser. No. 09/219,082, entitled "SYSTEM AND METHOD FOR ENHANCING MODEM PERFORMANCE USING DIGITAL SIGNAL PROCESSING TECHNIQUES."

BACKGROUND OF THE INVENTION

The present invention generally relates to communication protocols and more particularly to a communication protocol for transferring messaging information between a messaging server and a remote device over a communication network using an acoustically coupled modem.

Letters were once, and in some places still are, the sole method of long distant personal and business communication. Communication progressed through the telegraph period. The advent and proliferation of the telephone caused the telephone call to rival the letter as the preferred method of personal and business communication.

The Internet and widespread use of Personal Computers, led to electronic messaging, using a modem, as a popular method of communication for both personal and business uses. In effect, the letter and the telephone were combined. The Personal Computer produced the electronic message, i.e., letter, and this was transferred to the telephone network via a modem. Modems, which once were external and acoustical, are now embedded in Personal Computers, laptops, or Personal Digital Assistants.

However, these modems typically need a telephone jack, are slow in establishing a connection to an electronic messaging server, and are frequently error prone in transferring data. One problem with today's modem technology is that most public access telephones do not have an external jack. Thus, a business traveler at an airport would have to search for an external jack, even though many public telephones may be available.

Conventional acoustically coupled modems attempted to solve this problem by providing an easy connection to a telephone handset wherein a connection to RJ-4 or RJ-11 jack was not required. These modems were external devices connected to the Personal Computer with an telephone cradle to hold a telephone headset. A typical modem would have muffs over the earpiece and the mouthpiece of the telephone handset to filter out external noise. This interface between the telephone handset and the modem had several disadvantages including: 1) the modem was bulky, and 2) despite the mechanical damping, it was susceptible to noise; hence data transfer was error prone. Little or no error correction was used. These problems led to the conventional acoustically coupled modem losing popularity in the market.

There are several other problems associated with conventional acoustically coupled computer modems. The connection phase of modem operation includes an extensive handshaking procedure. The error detection and retransmission mechanisms used during the data exchange phase are inadequate and error prone. The net effect is to prolong the time on the telephone and delay the sending and receiving of electronic messages between remote device and messaging server.

Therefore in the blossoming market of electronic messaging, there is a need for a remote device which can communicate with a remote messaging sever via a telephone network in an expedited and error-free manner. A portable, hand-held acoustically coupled modem is needed, that can be easily connected to any telephone. The acoustically coupled modem should provide a fast and reliable connection procedure, and perform fast, robust, and error free data transfer. A goal should be the minimization of total time on the telephone needed for connection, data transfer, and disconnection.

SUMMARY OF THE INVENTION

The present invention uses an acoustic modem embedded in a remote device enhanced with automatic repeat-request and forward-error-correction routines to provide reliable transfer of electronic messages from the messaging server to the remote device. Embodiments according to the present invention, provide a fast, reliable connection sequence by use of a preamble frame. This fast and reliable transfer of data can reduce the user wait time for receiving or sending messages. This can also reduce the time that the modem needs to be physically coupled to the telephone handset.

According to an embodiment of the present invention, a method of communicating messages between a messaging server and a remote device is provided. The method includes a variety of steps such as establishing a connection between the messaging server and the remote communication device by transmitting a preamble frame. A step of exchanging data frames between the remote device and the messaging server is also included. The method then includes a step of detecting and correcting errors in received frames. The method can also include the step of re-transmitting received frames, if errors are uncorrectable.

In another aspect of the present invention, a method for error detection and correction during an exchange of frames between a messaging server and a remote device is provided. The method includes a variety of steps such as analyzing the packet type code of a received frame for errors. The interleaved packet in the frame may be de-interleaved. A step of BCH decoding the de-interleaved encoded packet is also included. The method may perform erasure correction, if the original and retransmitted decoded packets have uncorrectable errors. Next a step may be performed of majority bit combining and BCH decoding, if there are at least two retransmissions, and the original and both the retransmitted decoded packets have uncorrectable errors. The method may analyze the CRC check bits on the correctable decoded packets with the parity bits removed. If in one or more of the above steps, uncorrectable errors are found, there may be a request for a re-transmission by sending a non-acknowledge (NAK) frame.

The electronic messaging system and method of the invention may have a remote device comprising: processors, storage devices, and a communication subsystem containing the modem, and a messaging server comprising: processors, storage devices, and a network interface subsystem which is connected to the telephone system.

A further understanding of the nature and advantages of the inventions herein may be realized by reference to the remaining portions of the specification and the attached drawings.

DESCRIPTION OF THE SPECIFIC EMBODIMENTS

1. System Embodying The Present Invention

Figure 1A:
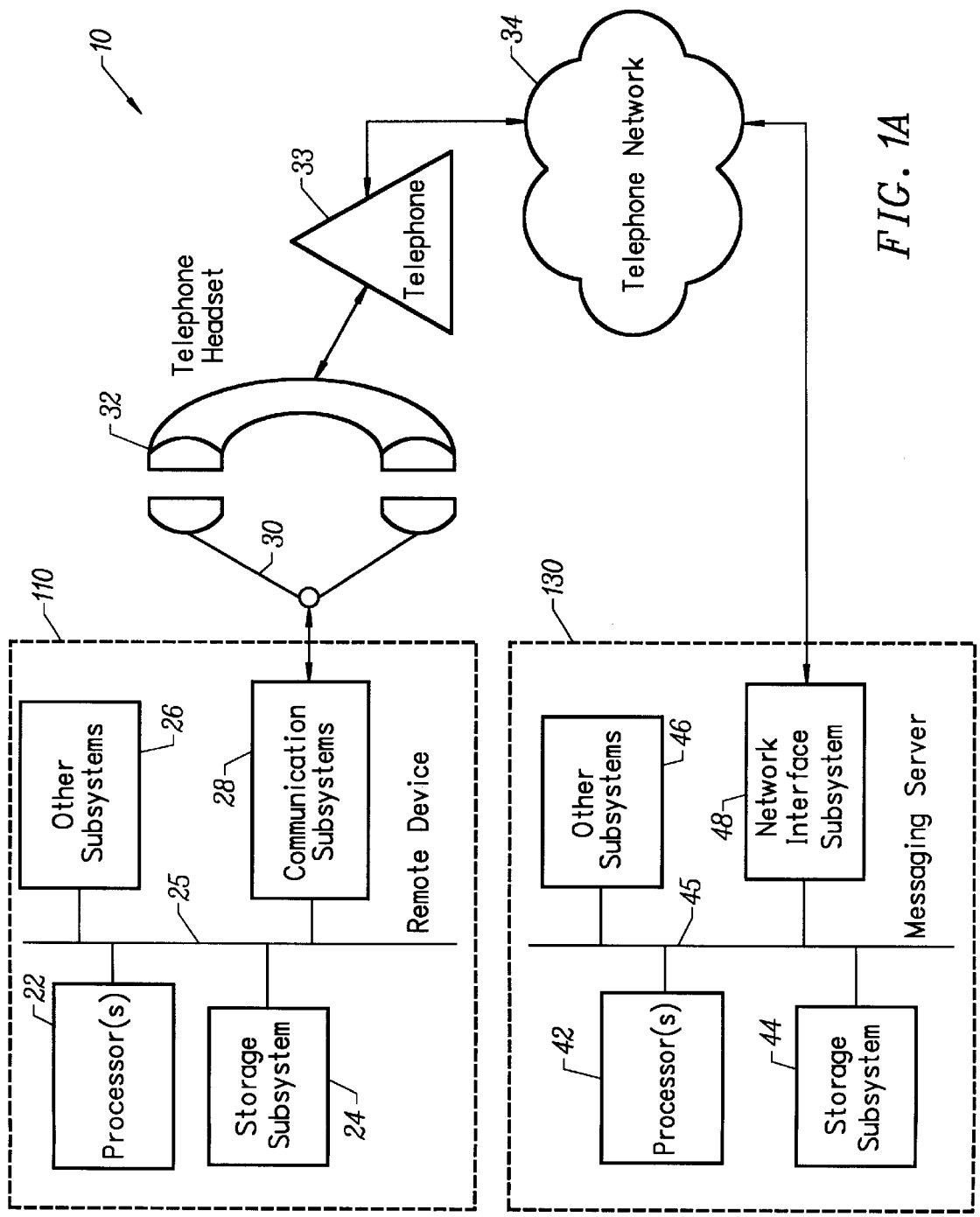
FIG. 1A shows a simplified block diagram of a representative embodiment of a messaging system, according to the present invention.

FIG. 1A shows a simplified block diagram of a specific embodiment of a messaging system embodying the present invention. The messaging system 10 includes a remote device 110 with attached modem coupling apparatus 30, a telephone handset 32 attached to a telephone 33 and telephone network 34, and a messaging server 130. The telephone network 34 may include land lines, e.g., copper wire, coaxial cables, fiber, and air links, e.g., satellites and cell phone transceivers, and microwave towers. Examples of the telephone 33 and accompanying handset include a desk unit, traditional rotary unit, public telephone box, or cell phone. The remote device 110 includes one or more processors 22, a storage subsystem 24 which may further includes RAM and ROM, bus 25, and a communication subsystem 28 which further includes an acoustically coupled modem which is connected to the modem coupling apparatus 30. The messaging server 130 includes one or more processors 42, a storage subsystem 44 which may include RAM, ROM and hard disks, bus 45, and a network interface subsystem 48. On the remote device 110, the communication protocol software may be stored in the storage subsystem 24 and executed by the processor(s) 22 and communication subsystem 28. The system is more fully detailed in copending U.S. patent application Ser. No. 09/218,911, (Attorney Docket No. 19185-000400US) entitled "SYSTEM AND METHOD FOR COMMUNICATING ELECTRONIC MESSAGES OVER A TELEPHONE NETWORK USING ACOUSTICAL COUPLING," which is herein incorporated by reference in its entirety for all purposes.

The communication link between the remote device and messaging server is through the communication subsystem 28, modem coupling apparatus 30, telephone handset 32, telephone 33, telephone network 34, and network interface subsystem 48. On the messaging server 130 the communication protocol software may be stored in the storage subsystem 44 and executed by the processor(s) 42 and network interface subsystem 48, also other subsystems as necessary to support the communication.

2. Email Interchange Example

Figure 1B:
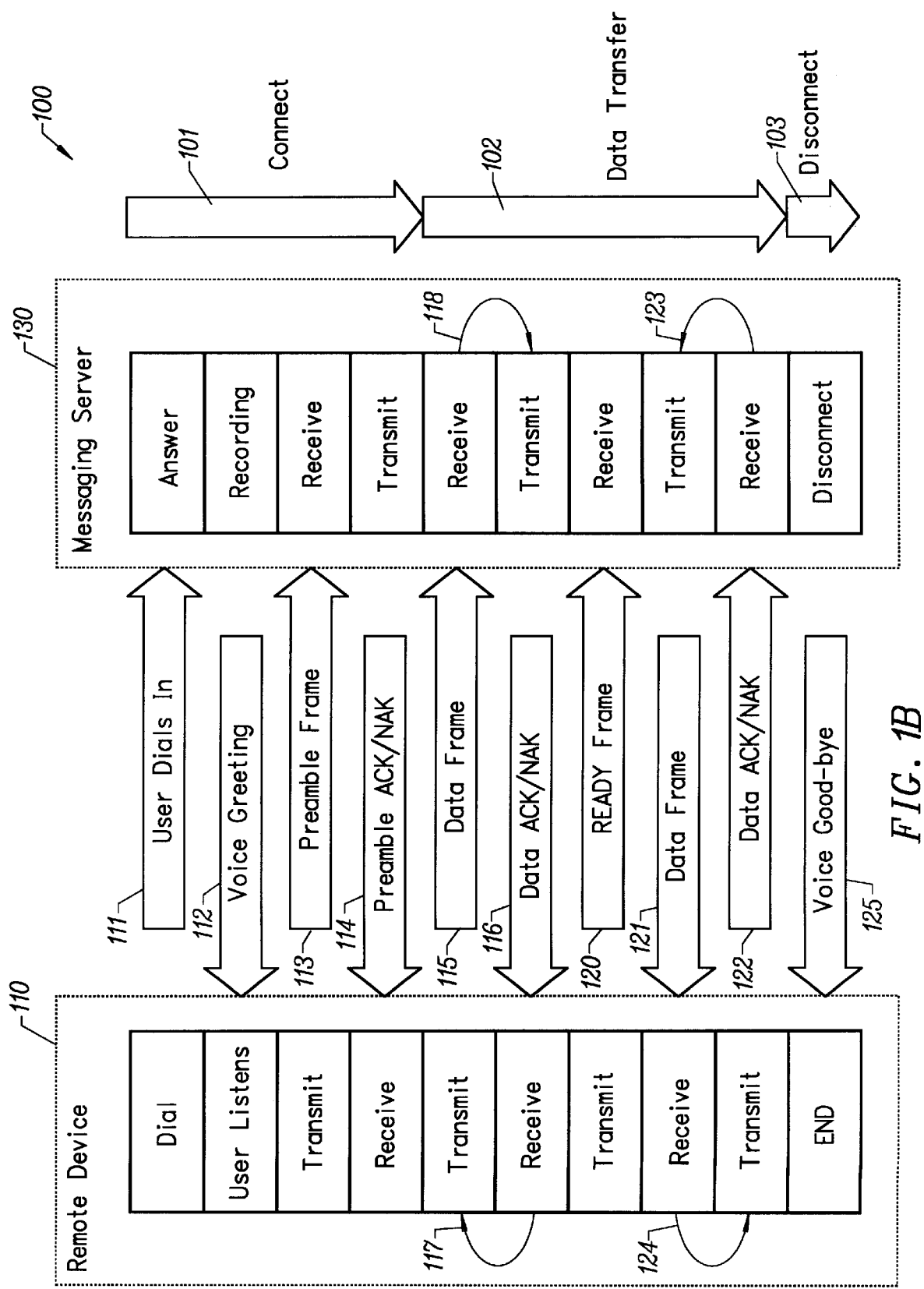
FIG. 1B is a simplified block diagram of a representative communication process between a remote device and a messaging server, according to the present invention.

FIG. 1B is a simplified block diagram illustrating the communication between a remote device, such as a remote device 110 in FIG. 1, and a messaging server, such as a messaging server 130 in FIG. 1, in accordance with one embodiment of the present invention. As shown, the communication 100 typically has three phases: a connection phase 101, a data transfer phase 102, and a disconnection phase 103. All data exchange is half-duplex; only one side, the remote device or messaging server, is transmitting on the line at any given time. In another embodiment the data exchange may be full-duplex.

2.1 Connection Phase

The connection phase 101 begins when a remote device user manually dials-in to the messaging server using an appropriate telephone number (step 111). The messaging server 130 answers the in-coming call and may play a voice recording (step 112). In other embodiments, the messaging server voice recording may be replaced by a synthesized voice, user or computer selectable recordings, or be missing entirely. During or after the recording, the user may push a "send" button on the remote device 110 to transmit a preamble frame 113 to the messaging server 130. In other embodiments, the messaging server may send the remote device the preamble frame 113, after the user dials in. If the messaging server detects no uncorrectable errors in the preamble frame, the messaging server 130 then transmits a preamble acknowledge (ACK) frame 114. If there are uncorrectable errors in the preamble frame then a non-acknowledgment (NAK) frame is sent.

Upon receipt of a NAK frame, the remote device retransmits the preamble frame. From the contents of the preamble packet, the messaging server determines the current remote device configuration and identification. The messaging server may execute this process concurrently with receiving data packets from the remote device. If the messaging server determines based on the identification information that the remote device is not recognized, the connection is terminated.

2.2 Data Transfer Phase

On successful recognition of the remote device and after the remote receives an ACK packet from the messaging server, the data transfer phase 102 begins. This phase normally has two sessions: a "receive" session during which the messaging server receives data from the remote data, and a "transmit" session during which the messaging server transmits data to the remote device. The "receive" session followed by the "transmit" session is considered one "communication session."

2.2.1 Receive Session

The receive session is the first part of the data transfer phase, where the messaging server receives data from the remote device. If the remote device has no data to send, then the remote device transmits a ready frame, and the receive session is skipped (step 120). If the remote device has data to send, then the remote device starts a receive session by sending a data frame. The receive session is broken-down by the remote device into discrete frames, and each data frame is sent to the messaging server 130 (step 115).

Upon receiving a data frame, the messaging server 130 analyzes the data frame for errors. If there are no uncorrectable errors the messaging server 130 transmits an ACK frame (step 116) back to the remove device 110. If uncorrectable errors are found, the messaging server 130 transmits a NAK frame (step 116) to the remote device 110. If the remote device receives a NAK frame, the previously transmitted data frame is retransmitted. The absence of either an ACK or NAK frame, within a specified timeout period, is treated as though a NAK has been received by the remote device. When on receipt of an ACK frame from the messaging server, the remote device 110 then sends the next data frame (step 115) to the messaging server 130. The messaging server may acknowledge the data frame by sending an ACK frame (step 116) back to the remote device 110. This sequence of steps process 115, 116, 117, 118 is repeated until the remote device 110 sends a final data frame (step 115) to the messaging server 130, when all data has been communicated from remote device 110 to messaging server 130 and then receives an ACK frame (step 116), if there are no uncorrectable errors. This ends the receive session.

2.1.2 Transmit Session

The transmit session is the second part of the data transfer phase, when the messaging server sends data to the remote device. If the messaging server has no data to send to the remote device, the following may occur: the messaging server sends an ACK NO DATA (not shown) instead of the ACK frame (step 116); the remote device does not send a READY frame; and the messaging server and remote device skip the transmit session and enter the disconnection phase 103.

If the messaging server has data to send to the remote device, the messaging server sends an ACK frame (step 116) to the remote device. The remote device 110 then prepares to receive data from the messaging server 130. When the remote device 110 is ready, it transmits a READY frame (step 120) to the messaging server 130. The messaging server then starts a transmit session. The messaging server 130 then sends a data frame (step 121) to the remote device. The remote device analyzes the data frame for errors and transmits an ACK or NAK frame (step 122) to the messaging server 130 depending on whether the analyzed data contained uncorrectable errors. Upon receipt of a NAK frame the messaging server retransmits the previously transmitted data frame. The absence of either an ACK or NAK frame is treated as though a NAK had been received. Upon receiving an ACK, the messaging server 130 then sends the next data frame (step 121) to the remote device 110, which again analyzes the frame for errors and transmits an ACK/NAK frame (step 122) back to the messaging server 130. Upon receipt of a NAK frame the messaging server retransmits the data frame.

The number of messages that the messaging server transmits is limited to the available free memory on the remote device. The amount of free memory available is specified in the FreeMem field of the preamble frame received from the remote device during the connection phase.

Steps 122, 123, 124, and 125 are repeated until the messaging server 130 sends its final data frame (step 121) to the remote device 110, when all data has been communicated from messaging server to remote device, and receives an ACK frame (step 122) in return. This ends the transmit session.

2.3 Disconnection Phase

The disconnection phase is initiated when the messaging server has received the ACK for the final frame. The disconnection phase 103 may include: the messaging server playing a "goodbye" voice recording, logging call and session statistics, and then hanging-up the line.

3.0 Protocol Format

Figure 2:
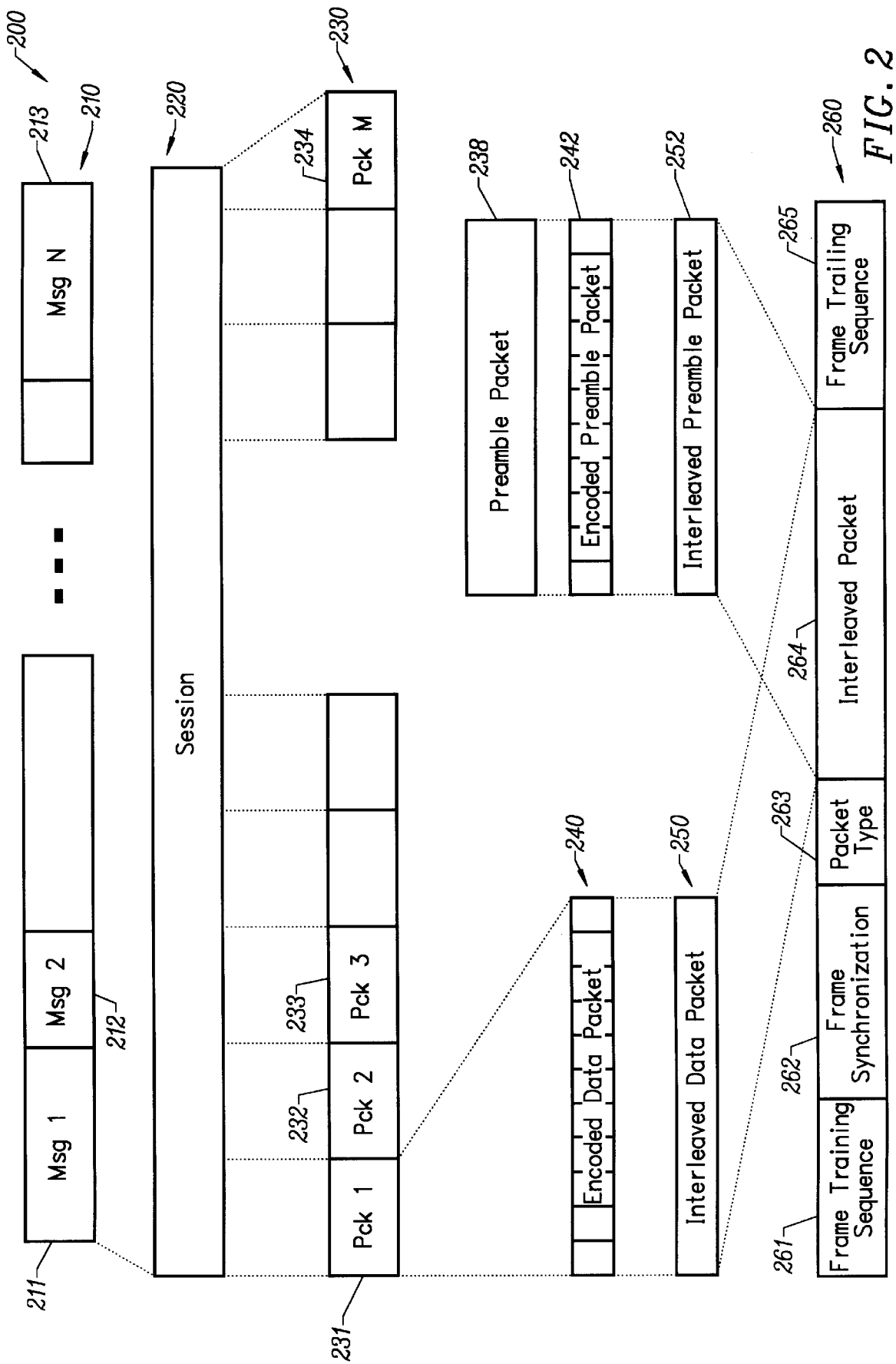
FIG. 2 is a simplified diagram of a representative communication protocol format, according to the present invention.

FIG. 2 is a diagram illustrating an overview of a communication protocol according to one embodiment of the present invention. Electronic messages 210 may be of non-uniform lengths. Each electronic message, e.g., 211, 212, 213, may contain E-mail, fax or pager message information. There may be 'N' electronic messages 210 transmitted between the remote device and messaging server, which may be concatenated to form a session 220. The two sessions (receive and transmit) occur during the data transfer 102 phase of FIG. 1. Each session 220 is divided into a series of 'M' fixed length packets, e.g., 231, 232, 233. The final packet 234 may be padded in order to accommodate the remainder of the session data and ensure a fixed packet length. Each of the 'M' packets is encoded using a Bose, Chaudhuri, Hocquenghem (BCH) code, (reference: Telecommunication Transmission Handbook, $3^{rd}$ Edition, Roger L. Freeman, John Wiley and Sons Inc., 1991, pp. 420–421), to produce an encoded data packet 240. Other encoding schemes may also be Reed-Soloman, Hamming and Viterbi, to name a few. Data packet 231, for example, is BCH encoded to produce encoded data packet 240. Encoded data packet 240 is bit interleaved to produce an interleaved data packet 250. The interleaved data packet 250 is then placed in a frame 260 as interleaved packet 264 to give a data frame. The interleaved packet 264 also may be an interleaved preamble packet 252, which is formed from an encoded preamble packet 242. The encoded preamble packet 242 is derived from a preamble packet 238 that has been BCH encoded. A frame including a preamble packet is called a preamble frame. Both the preamble and data frames include a frame training sequence 261, a frame synchronization sequence 262, a packet type 263, an interleaved packet 264, and a frame trailing sequence 265.

Figure 3:
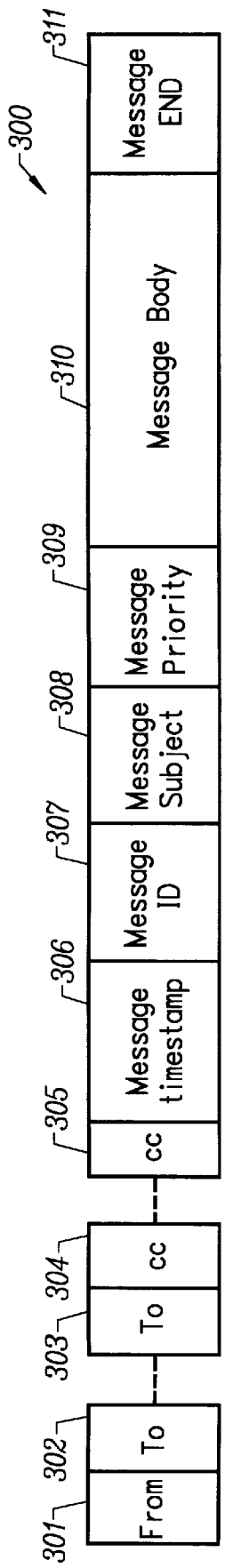
FIG. 3 is a simplified diagram of a representative message format.
Figure 4:
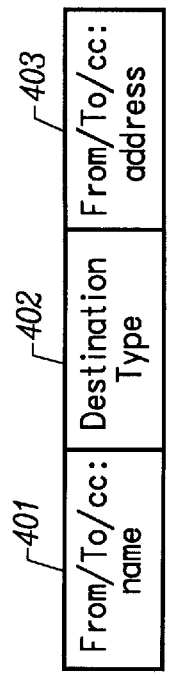
FIG. 4 is a simplified diagram of a representative message addresser/addressee format.

FIGS. 3 through 8 show additional details of the protocol format of FIG. 2. FIG. 3 shows a message format 300 of an electronic message such as message 211. The message format 300 has an address region 301–305, an information region 306–309, a message body 310, and a message end section 311. Not all fields or regions in message format 300 are required and some may be omitted. The address region 301–305 includes the "from" field 301, identifying the sender of the information, the "to" fields, 302, 303, identifying the person or persons receiving the information, and "cc" fields identifying carbon copy recipients, 304, 305. Each of the fields in the address region 301–305 is further subdivided as shown in FIG. 4, into a name field 401, a destination type field 402, and an address field 403. The name field 401 has the recipient's full name. The destination type 402 may be a code, indicating if the message is a fax or an E-mail message. The address field 403 contains information about the recipient's internet E-mail address or a facsimile number. In another embodiment, the destination type 402 may also include a pager textual message and the address may include a pager phone number and a PIN.

The header information 306–309 of FIG. 3 has a message time stamp 306, a unique message identifier (ID) 307, a message subject field 308, and a message priority 309. The message time stamp 306 is a date/time stamped on every message that is received by the messaging server. The message ID 307, is a unique label attached to each message. The message subject field 308 may be the subject line of an E-mail message. The message priority 309 indicates the order in which messages are processed, with higher priority messages being processed before lower priority messages. The message body 310 may be the body of an E-mail message. The message format 300 is created using from a sequence of identical elements called symbols. Each symbol is a 7 bit ASCII character. In another embodiment the symbols could be created using the CCITT 8-bit International Alphabet no. 5. For a specific embodiment of the present invention, Table 1 shows a specific conversion mapping of eight bit characters received by the messaging server to seven bit symbol characters for communication between the messaging server and the remote device.

TABLE 1

8-bit to 7-bit character conversion:

| Recvd char | Char sent to device | Recvd char | Char sent to device | Recvd char | Char sent to device |
|---|---|---|---|---|---|
| 0x80 | 0x20 | 0xB0 | 0x2A | 0xE0 | 0x61 |
| 0x81 | 0x20 | 0xB1 | 0x2B 0x2D | 0xE1 | 0x61 |
| 0x82 | 0x27 | 0xB2 | 0x32 | 0xE2 | 0x61 |
| 0x83 | 0x66 | 0xB3 | 0x33 | 0xE3 | 0x61 |
| 0x84 | 0x22 | 0xB4 | 0x27 | 0xE4 | 0x61 |
| 0x85 | 0x2E 0x2E 0x2E | 0xB5 | 0x75 | 0xE5 | 0x61 |
| 0x86 | 0x2B | 0xB6 | 0x50 | 0xE6 | 0x61 0x65 |
| 0x87 | 0x2B | 0xB7 | 0x2A | 0xE7 | 0x63 |
| 0x88 | 0x5E | 0xB8 | 0x7E | 0xE8 | 0x65 |
| 0x89 | 0x25 | 0xB9 | 0x31 | 0xE9 | 0x65 |
| 0x8A | 0x53 | 0xBA | 0x2A | 0xEA | 0x65 |
| 0x8B | 0x3C | 0xBB | 0x3E 0x3E | 0xEB | 0x65 |
| 0x8C | 0x4F 0x45 | 0xBC | 0x31 0x2F 0x34 | 0xEC | 0x69 |
| 0x8D | 0x20 | 0xBD | 0x31 0x2F 0x32 | 0xED | 0x69 |
| 0x8E | 0x20 | 0xBE | 0x33 0x2F 0x34 | 0xEE | 0x69 |
| 0x8F | 0x20 | 0xBF | 0x3F | 0xEF | 0x69 |
| 0x90 | 0x20 | 0xC0 | 0x41 | 0xF0 | 0x65 |
| 0x91 | 0x27 | 0xC1 | 0x41 | 0xF1 | 0x6E |
| 0x92 | 0x27 | 0xC2 | 0x41 | 0xF2 | 0x6F |
| 0x93 | 0x22 | 0xC3 | 0x41 | 0xF3 | 0x6F |
| 0x94 | 0x22 | 0xC4 | 0x41 | 0xF4 | 0x6F |
| 0x95 | 0x2A | 0xC5 | 0x41 | 0xF5 | 0x6F |
| 0x96 | 0x2D | 0xC6 | 0x41 0x45 | 0xF6 | 0x6F |
| 0x97 | 0x2D | 0xC7 | 0x43 | 0xF7 | 0x2F |
| 0x98 | 0x7E | 0xC8 | 0x45 | 0xF8 | 0x30 |
| 0x99 | 0x20 | 0xC9 | 0x45 | 0xF9 | 0x75 |
| 0x9A | 0x73 | 0xCA | 0x45 | 0xFA | 0x75 |
| 0x9B | 0x3E | 0xCB | 0x45 | 0xFB | 0x75 |
| 0x9C | 0x6F 0x65 | 0xCC | 0x49 | 0xFC | 0x75 |
| 0x9D | 0x41 0x4D | 0xCD | 0x49 | 0xFD | 0x79 |
| 0x9E | 0x50 0x4D | 0xCE | 0x49 | 0xFE | 0x70 |
| 0x9F | 0x59 | 0xCF | 0x49 | 0xFF | 0x79 |
| 0xA0 | 0x20 | 0xD0 | 0x44 | | |
| 0xA1 | 0x21 | 0xD1 | 0x4D | | |
| 0xA2 | 0x63 | 0xD2 | 0x4F | | |
| 0xA3 | 0x4C | 0xD3 | 0x4F | | |
| 0xA4 | 0x6F | 0xD4 | 0x4F | | |
| 0xA5 | 0x59 | 0xD5 | 0x4F | | |
| 0xA6 | 0x7C | 0xD6 | 0x4F | | |
| 0xA7 | 0x53 | 0xD7 | 0x78 | | |
| 0xA8 | 0x22 | 0xD8 | 0x30 | | |
| 0xA9 | 0x28 0x63 0x29 | 0xD9 | 0x55 | | |
| 0xAA | 0x61 | 0xDA | 0x55 | | |
| 0xAB | 0x3C 0x3C | 0xDB | 0x55 | | |
| 0xAC | 0x2D | 0xDC | 0x55 | | |
| 0xAD | 0x2D | 0xDD | 0x59 | | |
| 0xAE | 0x28 0x72 0x29 | 0xDE | 0x50 | | |
| 0xAF | 0x2D | 0xDF | 0x42 | | |

3.1 Message Format

This section provides a more detailed description of the message format 300. In one embodiment, the control character delimiters are shown. The symbol CTL-E indicates the "message end" 311 of an uncompressed message. Another uncompressed message may be sent after the CTL-E, with each successive uncompressed message being terminated by CTL-E. For compressed messages, there are no termination symbols.

Figure 5:
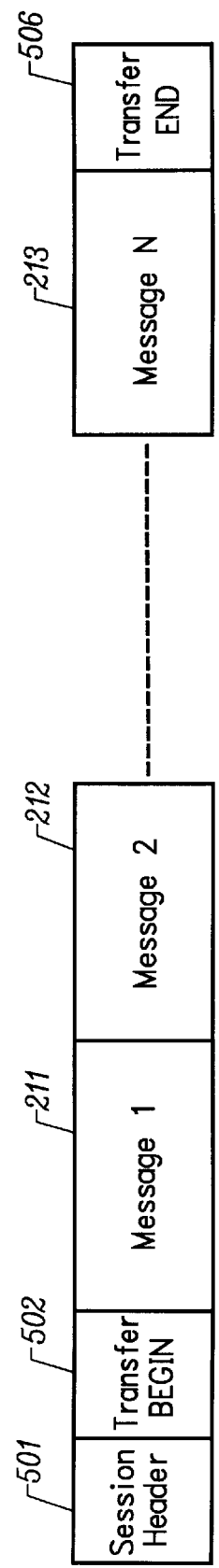
FIG. 5 is a simplified diagram of a representative session a format.

The first message of a session begins with the first symbol immediately following the Session Header (see FIG. 5, and description in section 3.2). If there are no messages to transfer, a Transfer End, CTL-D immediately follows the Session Header.

A Message format, minus the message body, is shown in table 2. The message starts with row 1 field 1, row 1 field 2, row 2 field 1, and row 10 field 2. The comments are not included in the message format, but are for clarification of the meaning of the rows.

TABLE 2

Message Format (without the message body)

| | Field 1 | Field 2 | Field 3 | Field 4 | Comments |
|---|---|---|---|---|---|
| 1 | <CTL-N> | <Fr: name> | <DestType> | <Address> | From: field |
| 2 | <CTL-T> | | | | To: fields |
| 3 | <CTL-N> | <To: name> | <DestType> | <Address> | |
| 4 | <CTL-N> | <To: name> | <DestType> | <Address> | |
| 5 | <CTL-F> | | | | cc: fields |
| 6 | <CTL-N> | <cc: name> | <DestType> | <Address> | |
| 7 | <CTL-N> | <cc: name> | <DestType> | <Address> | |
| 8 | <CTL-A> | <Timestamp> | | | Message Timestamp |
| 9 | <CTL-I> | <Message ID> | | | Message ID |
| 10 | <CTL-S> | <Subject> | | | Subject |

The message body is either in compressed or uncompressed format. For an uncompressed message body:

<CTL-G><Uncompressed Message Body>---Message Body

<CTL-E>---End of Message or compressed message body:

<CTL-H><a 14 bit word giving the length of the message body><Compressed Message Body The Message block starts with addressing parameters. First, the sender (Fr: field) should be sent followed by a CTL-T. The "from" component of a E-mail message is typically required. Even if "From Name" 401 and "Address" 403 are empty, the control codes should typically be sent at the beginning of an E-mail message.

Next, the list of primary recipients (To: fields) and the secondary recipients (cc: fields) are sent. A CTL-F symbol separates these two lists. All addresses before the CTL-F are primary recipients and all addresses after are secondary recipients. If there are no secondary recipients, then no CTL-F symbol is sent.

Each recipient has the above format to simplify parsing of the to/cc name and address. The to/cc name is preceded by a CTL-N symbol and is optional (except for a fax destination). If there is no name field, no CTL-N is sent. The name field is associated with the subsequent Dest Type and address, which begins with a CTL-C symbol. The DestType is a single symbol that indicates the type of address that immediately follows. It includes one of the following symbols:

1). <CTL-Z>: email address, standard address formats are supported.
2). <CTL-X>: fax phone number. A '1' is not required to precede the number, i.e. only area code and phone number are required, for example, 212-555-1212, not 1-212-555-1212 (hyphens are not required).

In another specific embodiment there may be a "P": pager address with the format "PIN@pager_phone_number," wherein PIN may be a maximum of 16 symbols which indicates the users personal identification code; "@" is a delimiter; and pager_phone_number may be up to a maximum of 16 symbols (each digit may be encoded as ASCII) identifying the telephone number of the pager. At least one primary recipient must be defined before the message may be sent to the messaging server by the remote device.

A CTL-A symbol precedes the message time stamp field. This field is typically used for all messages from the messaging server to remote device. This field is normally not present for remote device to messaging server, because the messaging server will add a time stamp to each message received from the remote device. This field has the structure defined in Table 3 below:

TABLE 3

Message Timestamp field:

| Symbol | Field Name | Description |
| --- | --- | --- |
| 0 | (year − 1900) | (e.g. 1997 − 1900 = 97 = 0x61) |
| 1 | month | (e.g. March = 3 = 0x03) |
| 2 | dayOfMonth | Day of month, from 1 to 31 |
| 3 | dayOfWeek | Day of week. Sunday = 0x00, Monday = 0X20, Tuesday = 0X40, . . . Saturday = 0XC0 |
| 4 | hour | Hour of day, from 0 to 23, in 24-hour time |
| 5 | minute | Minute of day, from 0 to 59 in BCD format |

A CTL-I symbol precedes the message identification (ID). The messaging server does not expect or need a message ID from the remote device. The messaging server assigns the message ID, and this field is ignored for messages received by the messaging server. The message ID uniquely identifies each individual message stored on the messaging server. The message ID field may contain 5 symbols. The first four symbols are used as the exclusive message identifier. The fifth symbol is used as an instruction for the remote device when the message preview mode is active. If the message preview mode is not active, the fifth symbol will be 'F'.

Each symbol of the four symbol identifier may contain any value between '0' (0x30) and "_" (0x5F).

The fifth symbol in the identifier will be either "B", "T", "F", "D", or "C".

A CTL-L symbol precedes a symbol designating the message priority. This field is optional. One specific embodiment one symbol may follow the CTL-L priority tag: 'E' for emergency, 'H' for high, 'N' for normal, 'L' for low. In another embodiment, the priority will determine the order in which messages are processed.

The message subject may be sent. A CTL-S symbol precedes the message subject data. If there is no subject field defined, then no CTL-S is sent and the optional message body immediately follows the addresses. There are two ways for the messaging server to send the message body to the remote device: compressed or uncompressed. The messaging server makes a run-time decision if the message body should be compressed, based on the time savings that may be provided if the message bodies are compressed, and if the remote device supports compression. If the messaging server decides to compress the message body, then the compressed message body with uncompressed header is sent to the remote device. The remote device may send uncompressed message bodies to the messaging server. In another embodiment, the remote device may send both uncompressed or compressed message bodies to the messaging server.

An uncompressed message body begins with a CTL-G symbol. The contents of the message body follow the CTL-G and the message is terminated with a CTL-E. A compressed message body begins with a CTL-H symbol. The next two 7-bit symbols contain the 14-bit maximum length of the compressed message body stream with the most significant bit (MSB) first, i.e., a fixed integer number, N1, of bytes. The remainder of the message body contains the compressed message body. The message ends after the compressed message body.

Details about the compression algorithm are in copending application U.S. patent application Ser. No. 09/218,917, (Attorney Docket No. 19185-000300US) entitled "SYSTEM AND METHOD FOR COMPRESSION AND DECOMPRESSION OF ELECTRONIC MAIL MESSAGES," which is herein incorporated by reference in its entirety for all purposes.

3.2 Session Format

Figure 6:
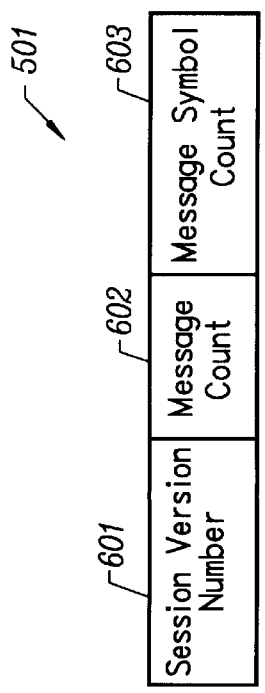
FIG. 6 is a simplified diagram of a representative session header format.

After the preamble frame is sent to the messaging server, the messaging server responds with an acknowledgment frame. The data transfer occurs with the receive session followed by the transmit session. The session format 220 of FIG. 2, is shown in more detail in FIG. 5 and FIG. 6. FIG. 5 is a session format diagram. The session includes session header 501, followed by one or more delimiters 502. The delimiters may be a control character such as CTL-B. The delimiters 502 may be followed by series of N concatenated messages 211 through 213, followed by a delimiter, e.g., CTL-D, marking the transfer end 506. FIG. 6 shows the session header format 501 in more detail. The session header from the messaging server to the remote device has a session version number 601, a count of the amount of messages 602, which should be about N, and the message symbol count 603, which is approximately the number of symbols in the N messages.

3.3 Packet Format

Figure 7:
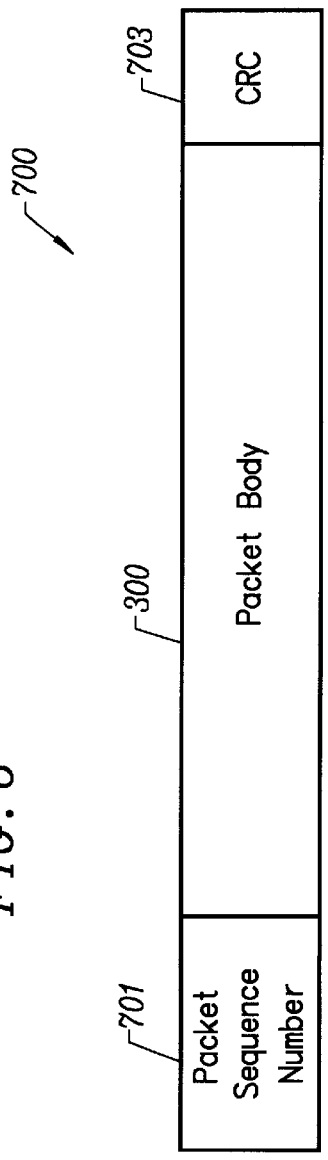
FIG. 7 is a simplified diagram of a representative data packet format.

Each session 220 may be divided into a series of fixed packets 230, 231 through 234. In one embodiment of the present invention, the length is 132 symbols. FIG. 7 shows a data packet 700, 231 in FIG. 2, having a packet sequence number 701, packet body 702 containing the data, and a cyclic redundancy code (CRC), i.e., error detection code 703. Table 4 shows in more detail the three fields in FIG. 7. Referring now to Table 4, symbol 0 describes the data packet sequence number 701, which is a modulo eight counter that increments each time a new data packet is transmitted. The purpose of the packet sequence counter is to detect duplicate packets due to rebroadcast. The receiver checks the packet sequence value of the data packet. If the count is the same as the previous data packet, then an ACK frame is transmitted and the data packet is ignored. If the count is that of the previous data packet plus one modulo eight, indicating that it is the expected next data packet, then the data packet is analyzed for errors. For the other six counts the connection is terminated. In another embodiment, the packet sequence count may be used to determine if the packets are out of sequence. Up to seven data packets may be stored in a buffer and the sequence number checked. The data packets may then be re-ordered to form a sequential series of data packets.

In one embodiment, symbols 1 to 127 contain the session data 220, and symbols 128 to 131 contain the CRC-28 error detection code. In this embodiment a non-standard CRC with a polynomial of degree 28 is used. In other embodiments a standard CRC, for example, CRC-12, CRC-16, or others known by one of ordinary skill in the art may be used.

TABLE 4

Data Packet Fields:

| Symbol | Field Name | Description |
| --- | --- | --- |
| 0 | Packet Sequence | A modulo 8 counter is implemented, that increments with each new packet transmitted; when packets are rebroadcast due to errors, this counter is not incremented. |
| 1–127 | Packet Body | 127 symbols of packet data. |
| 128129 130131 | CRC-28 | The 28-bit CRC calculated on the packetSequence, and packetData. |

The CRC-28 polynomial is: $x^{28}+x^{26}+x^{24}+x^{23}+x^{18}+x^{17}+x^{16}+x^{15}+x^{14}+x+x^{8}+x^{4}+x^{3}+1$. This polynomial was selected for use with four 7-bit symbols.

In another embodiment, the CRC-28 code is generated by using table "fcstab_32" representing the 128 ASCII characters possible with a 7 bit symbol. The CRC generation is shown by the following pieces of "C" code. Each four entries, i.e., the four bytes: v0, v1, v2, v3, of the table fcstab_32[0:511], is a 28-bit intermediate CRC polynomial factor for an ASCII symbol. This permits CRC generation, crc_val[0:4], using only a single array subscript of fcstab_32. UNIT16 is unsigned short, UNIT8 is unsigned char, P0=0x1A, P1=0x7C, P2=0x24, and P4=0x4C. "crc_bld_tb1" is the routine that creates the table. "pppfcs32(char*cp, UNIT8 len)" calculates the 4 symbol CRC, given a packet of 128 symbols, len=128, represented by the pointer "cp".

```
void crc_bld_tbl(void)
{
UNIT16 b;
UNIT8 i, j, v0, v1, v2, v3;
j = 0x40;
for (b = 0; ; )
{ v0 = (UINT8)b; v1 = 0; v2 = 0; v3 = 0;
```

-continued

```
for (i = 7; i--;)
{if(v0 & 1)
    {v0 = (v1 & 1)? (((UINT8)(v0 >> 1 ) | j) P0) :
    (UINT8) (v0 >> 1) ^ P0;
    v1 = (v2 & 1)? (((UINT8) (v1 >> 1) | j) ^ P1) :
    (UINT8) (v1 >> 1) ^ P1;
    v2 = (v3 & 1)? (((UINT8) (v2 >> 1 ) | j) ^ P2) :
    (UINT8) (v2 >> 1) ^ P2;
    v3 = (UINT8) (v3 >> 1) ^ P3;
    }
else
    {v0 = (v1 & 1)? ((UINT8) (v0 >> 1 ) | j) : (UINT8)
    (v0 >> 1);
    v1 = (v2 & 1)? ((UINT8) (v1 >> 1 ) | j) : (UINT8)
    (v1 >> 1);
    v2 = (v3 & 1)? ((UINT8) (v2 >> 1) | j) : (UINT8)
    (v2 >> 1);
    v3 = (UINT8) (v3 >> 1);}
}
fcstab_32[4*b] = v0 & 0x7f;
fcstab_32[4*b+1] = v1;
fcstab_32[4*b+2] = v2;
fcstab_32[4*b+3] = v3;
if (++b == 128)
    break; }
}
}
void pppfcs32(char *cp, UINT8 len)
{UNIT16 i; crc_val[0] = 0; crc_val[1] = 0;
crc_val[2] = 0; crc_val[3] = 0;
while (len--)
    {i = ( crc_val[0] ^ (*cp++)) << 2;
    crc_val[0] = fcstab_32[i] ^ crc_val[1];
    crc_val[1] = fcstab_32[i+1] ^ crc_val[2];
    crc_val[2] = fcstab_32[i+2] ^ crc_val[3];
    crc_val[3] = fcstab_32[i+3];
    /* fcs = (((fcs) >> 7) ^ fcstab_32[((fcs) ^ (*cp++))
    & 0x7f]); */
    }
return;
}
```

In another embodiment, shown by the following piece of "C" software code, a routine generates a 28-bit checksum for a string of 896 data bits (equivalent to 128 7-bit symbols). "Data [0–895]" is the string of data bits, and c0 to c27 are the 28 bits in the CRC generator. At the end of the $896^{th}$ loop, c0 through c27 contain the 28 CRC-28 bits that are appended to the data.

```
for (i = 0; i < 896; i++)
    {temp=data[i]^c27; c27=c26; c26=c25^temp;
    c25=c24; c24=c23^temp; c23=c22^temp; c22=c21;
    c21=c20; c20=c19; c19=c18;
    c18=c17^temp; c17=c16^temp; c16=c15^temp;
    c15=c14^temp;
    c14=c13^temp; c13=c12; c12=c11; c11=c10^temp;
    c10=c9;
    c9=c8; c8=c7^temp; c7=c6; c6=c5; c5=c4;
    c4=c3^temp; c3=c2^temp;
    c2=c1; c1=c0; c0=temp;}
```

Figure 8:
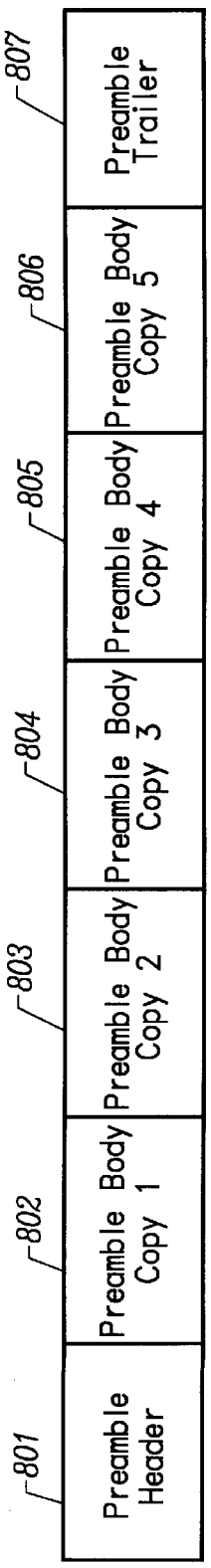
FIG. 8 is a simplified diagram of a representative preamble packet format.

FIG. 8 shows preamble packet format 238, which is transmitted by the remote device 110 to the messaging server 130, as part of preamble frame 113. This packet is transmitted before the session 220 begins and may be the same size as the data packet: 132 symbols. The preamble packet format 238, has a preamble header 801 which delineates the start of the preamble packet, Q identical copies of a preamble body 802 through 806, and a preamble trailer 807 which pads the end of the packet with symbols containing zero to fill out the packet size to the 132 symbol length. Q is an odd integer to provide for majority voting. In a specific embodiment, shown in FIG. 8, Q equals to 5. The preamble header 801 may have a CTL-P followed by two zero symbols to give 21 bits. Table 5 shows the format of one copy of the preamble body in FIG. 8. Symbols 20–23 may have the CRC-28 error correction code for a copy of the preamble body.

4. Packet Encoding

Each packet, (either a data packet 700, e.g., 231 or a preamble packet 800, e.g., 238.) is encoded using a BCH (26, 21) error detection and correction code. In this embodiment a packet is typically 132 symbols in length. The 132 symbols can be grouped into 44 groups of 3 symbols per group. Each group of 3 symbols is 21 bits. These 21 bit groups have appended to them 5 parity bits to give the 26-bit BCH codewords. Thus there are 44 26-bit groups, i.e., 44 BCH codewords. The 44 BCH codewords form the encoded packet.

The following piece of "C" program code demonstrates the method for encoding data using the BCH(26,21) code. The 21 bits of data are represented in data[0–20] and p4, p3, p2, p1, p0 represent the 5 parity bits to give the 26 bit group. The "^" is the "exclusive or" operator.

```
/*Initialize the parity variables to 0*/
p0=0; p1=0; p2=0; p3=0; p4=0;
/*Shift in data*/
for(i=0;i<21;i++){
    temp=p4^data[i];
    p4=p3;
    p3=p2;
    p2=p1^temp;
    p1=p0;
    p0=temp;}
```

The 5 parity variables contain the parity bits to be appended to the end of the data bits. The parity bits should be appended in the order p4 p3 p2 p1 p0, with p4 being the first bit transmitted after the data and p0 the last bit.

The BCH (26,21) code is a representative embodiment of BCH encoding and decoding techniques. A BCH (15,7) code may also be used in alternate embodiments. Eight parity bits could be appended to each symbol (7 bits), rather than five parity bits to each three symbols (21 bits). Such an error detection and correction code could be used in a relatively noisy transmission environment.

The encoded data packet is then interleaved to form the interleaved packet. The encoded preamble packet is also interleaved and may be sent as the interleaved packet in place of the interleaved data packet.

Since there are 44 BCH codewords in an encoded packet, the interleave may be achieved in 44 ways. This means that the first bit of each of the 44 BCH codewords is transmitted, then the second bit of each of the 44 codewords, through the 26$^{th}$ bit in each of the 44 code words. This can be visualized as follows: label the pre-interleaved data, parity, and CRC bits as b0 b1 b2 b3 b4 through b1143. The bits in the first BCH codeword are b0 b1 b2 b3 through b25. The bits in the second BCH codeword are b26 b27 b28 b29 through b51. This pattern continues, with the last codeword being b1118 through b1143. These bits are transmitted in an interleaved order: b0 b26 b52 b78 through b1118 b1 b27 b53 through b25 b51 b77 through b1143.

5. Frame Format

The interleaved packet is then put in a frame 260. A preamble frame includes an interleaved preamble packet, whereas a data frame includes an interleaved data packet. The framing training sequence 261 is transmitted to the receiver at the beginning of each frame. The purpose of the frame training sequence is to have the receiver lock to the communication signal reliably in the shortest time. Because of the different implementations of messaging server and remote device receiver modems, the frame training sequence from messaging server to remote device is different than from remote device to messaging server.

TABLE 5

Preamble Packet Format

| Symbol | Name | Description |
| --- | --- | --- |
| 0.00 | Protocol | Protocol version number |
| 1 | Packet Size | Packet size code, indicates packet size (in symbols):0x01 means all packets are 132 symbols |
| 2 | Remote device Model | Remote device Model number, indicates modulations options via a table lookup on the messaging server. |
| 3–4 | LTD Flag, SECUR Flag, and type of compression | Specifies configurable Remote device options that may change from session to session. LTD = Limited Bandwidth selection bit (bit 0)Indicates if the sending station is operating over a limited bandwidth channel (e.g. digital or cellular). SECUR = Security Bit (bit 1) Indicates if the data is encrypted. Bits 2–4 denote compression type. Bit 4 indicates if there is Huffman Compression. |
| 5 | FEC Type | 16 types of FEC are supported. 0x00:No FEC; 0x01:BCH (26, 21) encoding. |
| 6 | Interleave | Number of ways FEC encoded data is interleaved. |
| 7–11 | SHU ID | Uniquely identifies the remote device. |
| 12–13 | FreeMem | Number of blocks available in the remote device for downloading new messages. If this value is zero, the messaging server may not download any new messages to the remote device. |
| 14–15 | MSGS | Total number of messages that will be sent by the remote device to the messaging server during the current transmit session. |
| 16–19 | unused | Reserved for future use. |
| 20–23 | CRC | A 28-bit CRC checksum is generated from the preamble contents and appended at the end of each preamble copy using the same generating function used for the data packet. |

In a specific embodiment, the frame training sequence from the messaging server to the remote device is 40 bits long. It starts with 8 pairs of 01, followed by 24 bits of 1. The 01 toggle pairs are for the remote device to quickly synchronize to the carrier signal. The following 1's are to have the remote device settle on the carrier and prepare to receive the frame synchronization bytes.

In a specific embodiment, the frame training sequence from the remote device to the messaging server is 116 bits long. It starts with 48 bits of 1's, followed by 24 pairs of 01, ended by 28 bits of 1's. The 1's at the beginning allow the messaging server to detect the transmitting signal. The 01 pairs following the 1's allow the messaging server to synchronize to the carrier frequency. The 28 bits of 1's allow the messaging server settle on the carrier and prepare to receive the frame synchronization bytes. In a specific embodiment the frame synchronization 262 has 2 consecutive bytes of zeroes; each byte delimited by a start and a stop bit. The frame trailing sequence 265 comprises a series of 1's with sufficient length so that the receiver can recognize the end of the frame, e.g., about 30 bits.

Table 6 shows the codes for the packet type 263 in FIG. 2. There are six packet types: the non-acknowledge (NAK), acknowledgment (ACK), data_type, acknowledgment with no data, final data, and ready packets. The frame designation is defined to be the same as the included packet type, for example, an ACK frame includes an ACK packet type. In a specific embodiment, each packet type code is a 16 bit code, which is selected such that the Hamming distance between each word is eight. When a packet type code is received, it is correlated against one of the pre-determined packet type codes in Table 6. If no more than three bit errors have occurred then one of the correlations will be the highest. The received packet type code is corrected, i.e., replaced, by the code with the highest correlation. If four bits errors have occurred then it is possible that two of the highest correlations will be the same; in that case an uncorrectable error has been detected and a retransmission is requested. If five or more bit errors have occurred then it is possible that the incoming packet type code correlates to the wrong pre-determined 16 bit packet type code and there is a miscorrection. In this specific embodiment, the pre-determined value, above which the errors are uncorrectable packet types is three.

TABLE 6

Packet Types

| code | Packet Type | Description |
| --- | --- | --- |
| 8537 | ACK | Acknowledge receipt of frame with no uncorrectable errors |
| 0f59 | NAK | Non-acknowledgment; uncorrectable errors found and frame re-transmission requested. |
| 323d | DATA_TYPE | Data packet or preamble packet |
| 7ac8 | ACK NO DATA | Sent by messaging server to ACK the FINAL DATA packet from remote device, when messaging server has no data to send. |
| 6b23 | FINAL_DATA | Last data packet |
| ee14 | READY | Remote device ready to receive data from messaging server |

6. Processing of Received Frame

Figure 9A:
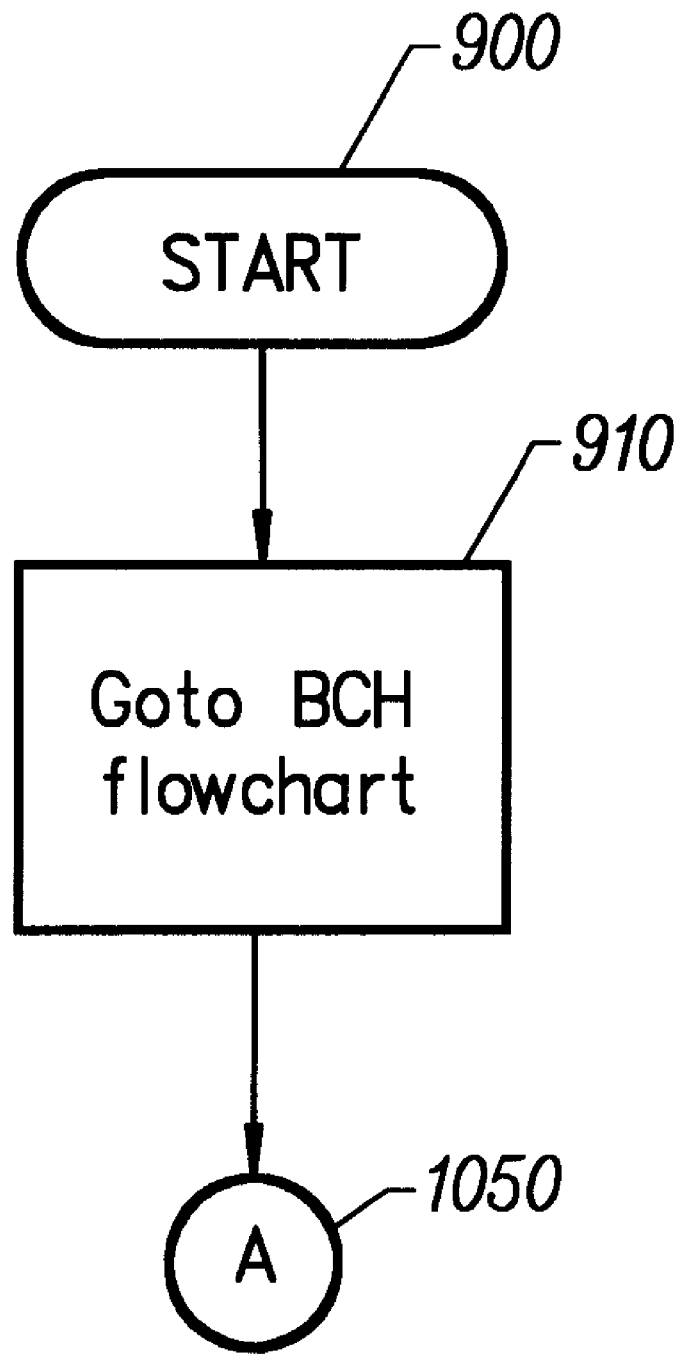
FIGS. 9A, 9B, 9C, 9D and 9E are simplified flowcharts of a representative process used in receiving a frame, according to the present invention.
Figure 9B:
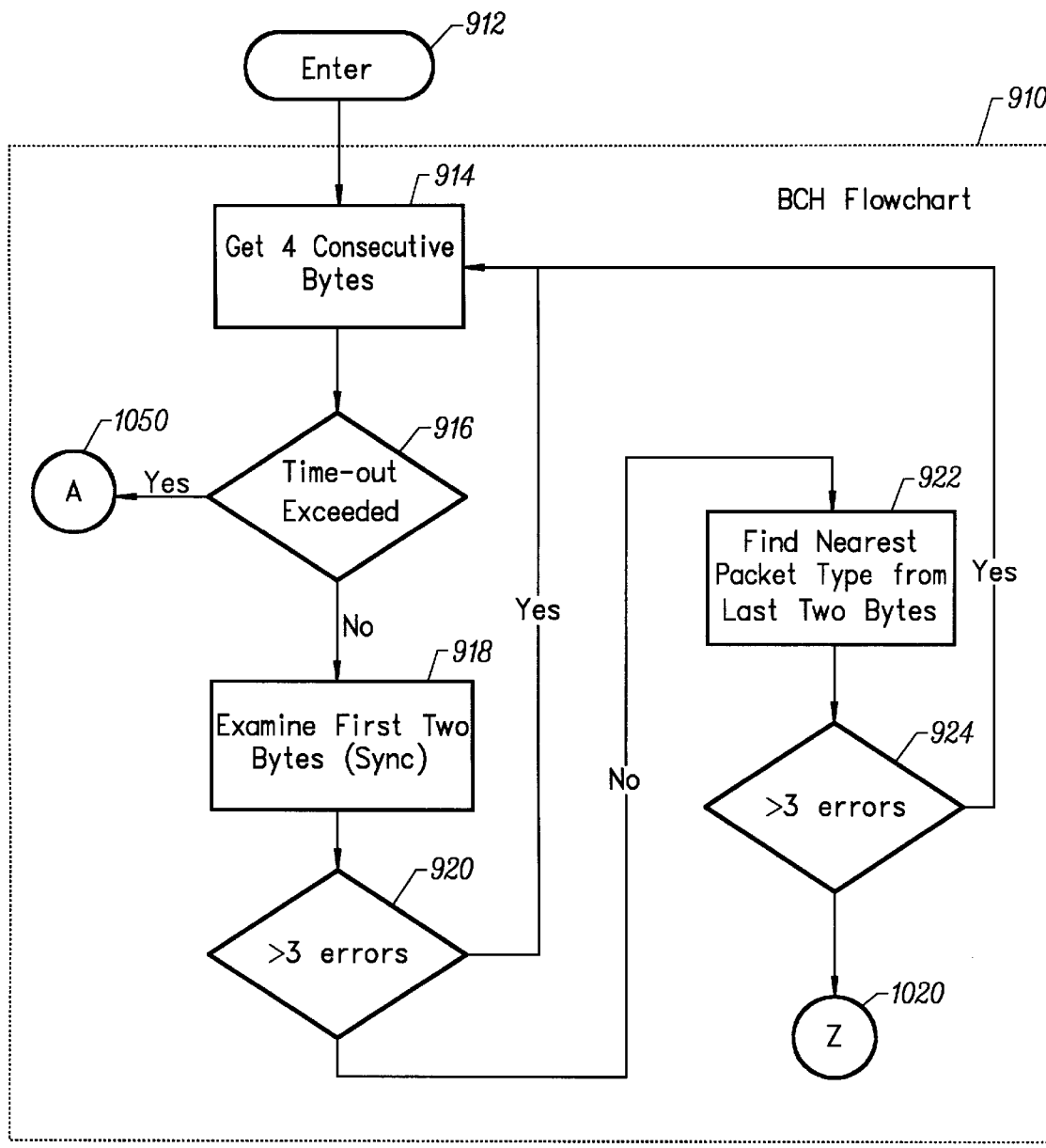
Figure 9C:
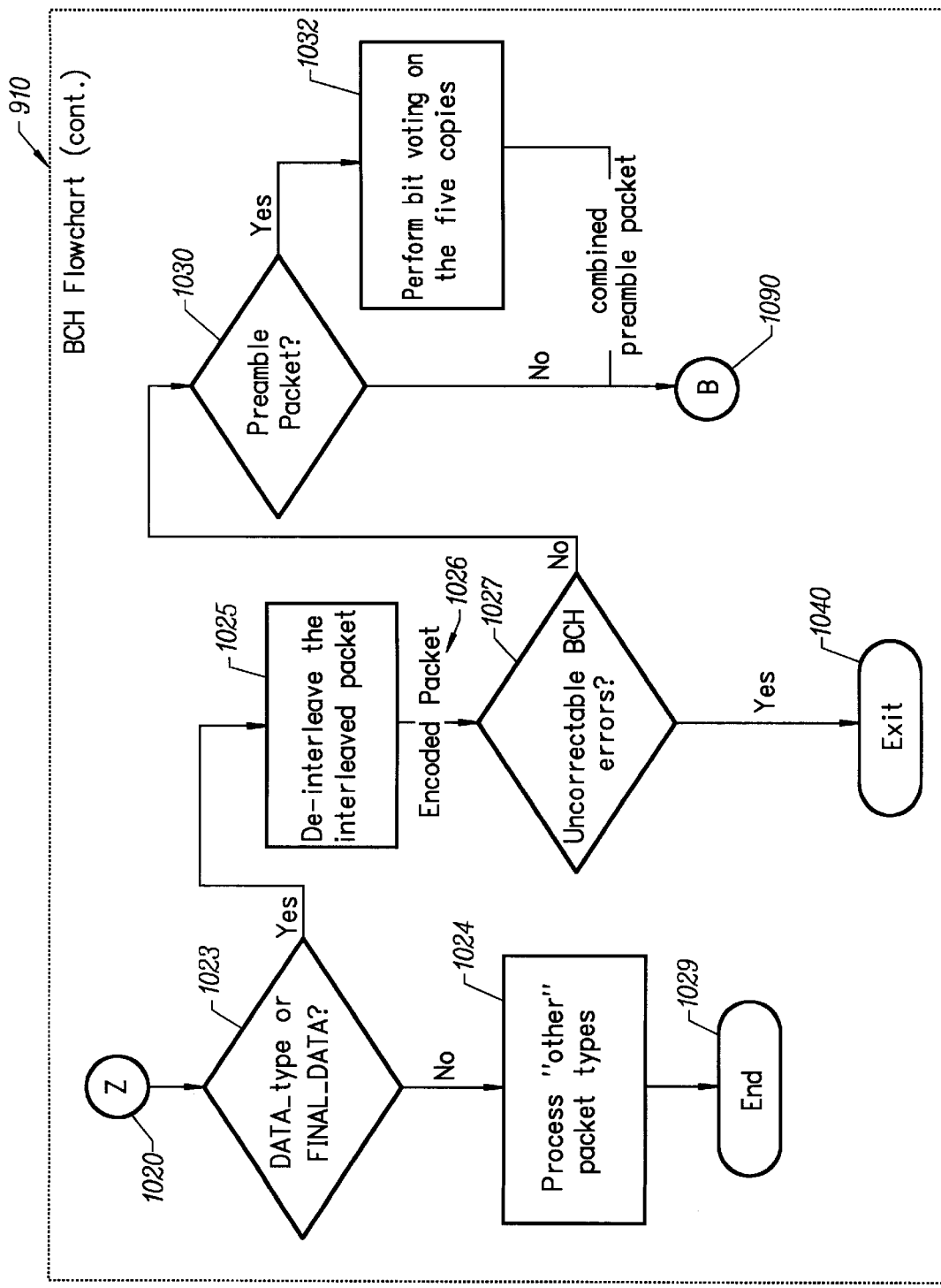
Figure 9D:
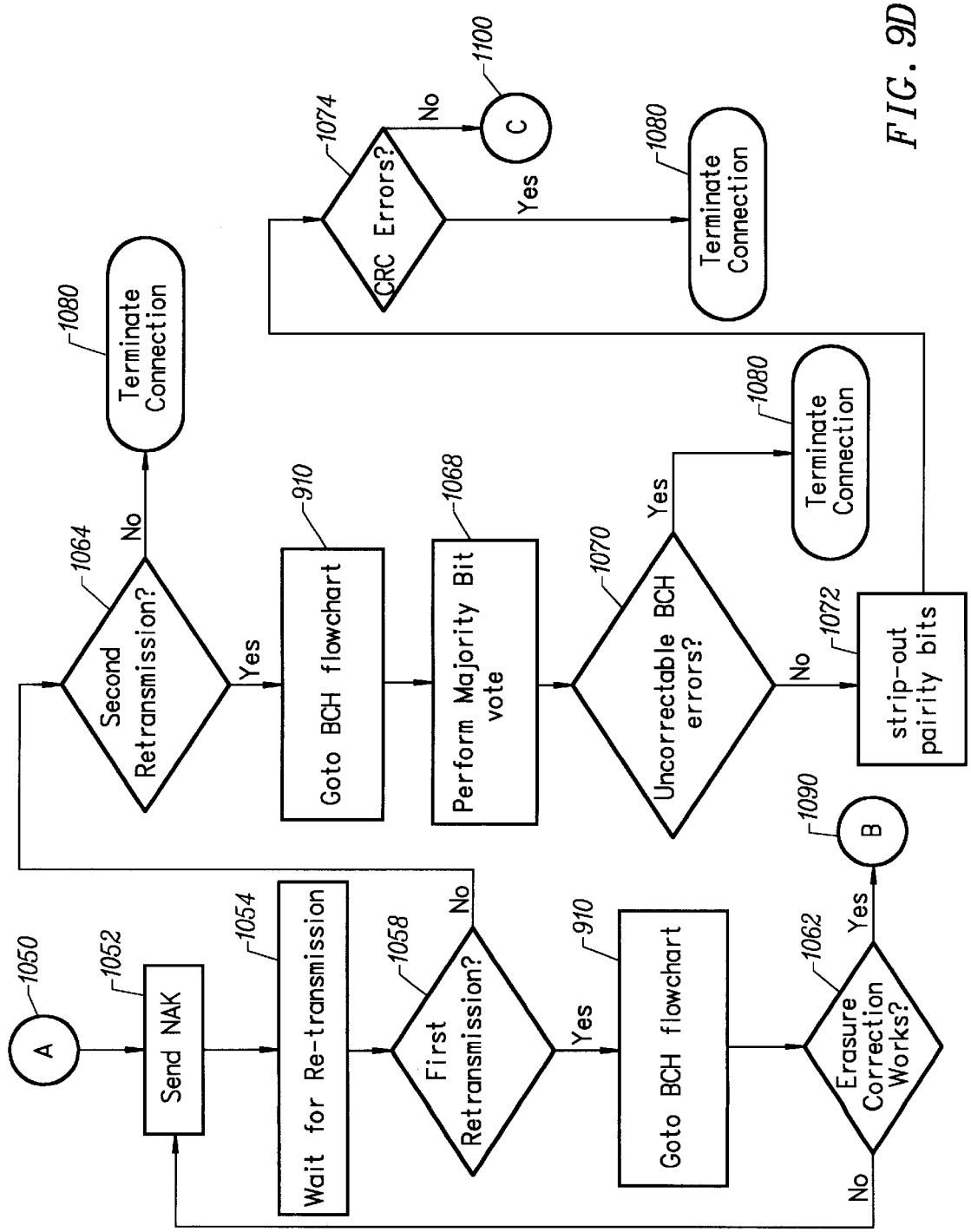

FIGS. 9A, 9C, 9C, and 9D depict a flow chart illustrating processing of a frame received by either the remote device or messaging server.

For all frames in one specific embodiment, there is an initial error detection in the packet type. If there is more than 3 bits Hamming distance between the received packet type and the eight reference packet types in Table 6, this indicates an uncorrectable error in the received frame and a NAK is sent by the messaging server requesting retransmission of the frame.

In a one embodiment of the invention, there are generally three layers of error detection and correction provided for data packets: 1) BCH (26,21) decoding with CRC-28 error detection; 2) Automatic Repeat Request (ARQ) which includes an ACK for a received frame with correctable errors and a NAK and retransmission for a frame with uncorrectable errors; and 3) Erasure correction and packet majority combined with BCH decoding, which allows error correctable packet data to be recovered from successive packets, each of which may have uncorrectable errors. The above three steps are "data forward error detection and correction."

In a specific embodiment, for preamble packets in addition to the above three layers of error detection and correction, there is a fourth layer which includes multiple identical copies of the preamble body. This adds diversity to the preamble packet. This step in addition to the three steps for "data forward error detection and correction" is "preamble forward error detection and correction."

In another embodiment, data Forward Error Correction (FEC) for the data packet includes BCH decoding, erasure correction and packet majority combining with BCH decoding. Preamble FEC for the preamble packet includes BCH decoding, erasure correction, packet majority "bit combining" with BCH decoding, and a majority vote combining of the multiple copies of the preamble body.

FIG. 9A shows the start of the receive process at the messaging server or remote device. The frame, including the interleaved packet, arrives at the receiver. The interleaved packet with a "DATA_TYPE" or "FINAL_DATA" packet type per Table 6 may contain an interleaved encoded data packet or an interleaved encoded preamble packet. The received frame goes to the BCH flow chart 910.

FIG. 9B shows the steps for performing BCH processing (flow chart 910). The frame enters the flow chart 910. The receiver searches for four consecutive raw bytes (step 914), each raw byte having a start bit, seven information bits, and a stop bit. The four consecutive bytes form a four byte window, which is shifted by one byte at a time. When there are four consecutive raw bytes, the start and stop bits are stripped out. The receiver will set a time-out, based on an expected packet category type. The two expected packet category types are: a data category, which includes the DATA_TYPE and FINAL_DATA packet category types, and a non-data category, which includes the non-data four packet types. Illustrative time-outs for the data category is about 4 seconds and for the non-data category is about 3 seconds. Next, the time interval to get four correct consecutive bytes is tested to determine if a fixed time-out interval is exceeded (step 916). If the time-out interval is exceeded then go to node A 1050 to send a NAK 1052. If the time-out has not been exceeded, then the first two stripped bytes (step 918) are examined. In this specific embodiment the two stripped bytes are set to a fixed pattern of all 0's. If there are greater than three errors (step 920), then the next four consecutive bytes (step 914) are searched. This means shifting the 4-byte window by one byte. For example, if bytes 1 to 4 are examined and in bytes 1, 2 there are greater than three error's, then the next four bytes examined are 2 to 5. If there are three or less errors (step 920), then the next two stripped bytes are examined. The Hamming distance (step 922) is determined from the two stripped bytes to the nearest packet type from Table 5. If the Hamming distance is greater than three (step 924), then examine another four consecutive bytes (step 914). Otherwise, replace the received packet type with the correct packet type in Table 5 and go to node Z 1020, which is continued on FIG. 9C.

FIG. 9C is a continuation of FIG. 9B and starts at node Z 1020. Determine the packet type in (step 1023). If the packet type is "DATA_TYPE" or "FINAL_DATA," the interleaved packet is de-interleaved (step 1025) to produce an encoded packet 1026. For the four "other" packet type codes the receiver processes them (step 1024) and processing ends for the (step 1029). The disconnection phase is then started.

6.1 De-interleaving

The de-interleaving process is the reverse of the interleaving process. Label the received bits as r0 r1 r2 r3 r4 . . . r1143. This is bit by bit equivalent to b0 b26 b52 b78 . . . b1118 b1 b27 b53 . . . b25 b51 b77 . . . b1143. Because of the way the bits were interleaved at the transmitter, the first 44 of these bits are the first bits of each of the 44 BCH codewords, the next 44 bits are the second bits of each codeword, etc. Therefore, the bits that make up the first BCH codeword are r0 r44 r88 r132 . . . r1100, which is equivalent to b0 b1 b2 b3 . . . b25. The bits for the second codeword are r1 r45 r89 r133 . . . r1011, which is equivalent to b26 b27 b28 b29 . . . b51. This pattern continues, with the bits for the 44th codeword being r43 r87 r131 . . . r1143 which is equivalent to b1118 1119 . . . b1143.

6.2 BCH Decoding

After the packet has been de-interleaved, it must be decoded. The received encoded data packet or preamble encoded packet is then checked for uncorrectable BCH errors (step 1027). BCH(26,21) decoding corrects a one bit error in a BCH codeword. BCH(26,21) is derived in this invention from a BCH(31,26) code. This is a Hamming code. The BCH(26,21) decoding operation involves four steps: 1) computing the syndrome of a codeword of the received encoded data or encoded preamble packet, which is a quantity related to the error location; 2) looking up the error location corresponding to the syndrome in an error location look-up table; 3) correcting the erroneous bit in the codeword or labeling the codeword as uncorrectable ; and 4) repeating the first three steps for each of the 44 codewords.

The following section of a "C" program illustrates the algorithm for computing the syndrome for the BCH(31,26) code shortened to BCH(26,21). The syndrome bits are s0, s1, s2, s3, and s4. The BCH codeword is stored in codeword [0,25].

```
/*Clear syndrome flip-flops to 0*/
s0=0; s1=0; s2=0; s3=0; s4=0;
/*Compute syndrome*/
for(i=0;i<26;i++){
    temp=s4;
    s4=s3;
    s3=s2; s2=s1^temp;
    s1=s0;
    s0=codeword[i]^temp;}
```

The error location lookup Table 7 is as follows:

TABLE 7 error location look-up table.

| Address | Data | Address | Data |
|---------|------|---------|------|
| 0 | 99 | 16 | 4 |
| 1 | 0 | 17 | 10 |
| 2 | 1 | 18 | 30 |
| 3 | 18 | 19 | 17 |
| 4 | 2 | 20 | 7 |
| 5 | 5 | 21 | 22 |
| 6 | 19 | 22 | 28 |
| 7 | 11 | 23 | 26 |
| 8 | 3 | 24 | 21 |
| 9 | 29 | 25 | 25 |
| 10 | 6 | 26 | 9 |
| 11 | 27 | 27 | 16 |
| 12 | 20 | 28 | 13 |
| 13 | 8 | 29 | 14 |
| 14 | 12 | 30 | 24 |
| 15 | 23 | 31 | 15 |

The address column in this table contains the decimal equivalent of the binary word made up of the syndrome bits, i.e. {s4 s3 s2 s1 s0}, with s0 being the least significant bit and s4 being the most significant bit. The data column in the table is the bit position of the bit in error, with bit 0 being the last parity bit and bit 25 being the first data bit. (The bit numbering is the reverse of the reception order). The errors in bits 26–31 indicate an uncorrectable error, since the BCH(31,26) code is shortened to BCH(26,21), and these bits are not used. Also, the "99" entry in table address "0" is meant to indicate that no error has occurred. The correctable erroneous bit is inverted in its current bit position.

If there are no uncorrectable BCH errors, then the decoded packet is tested to determine whether it is a preamble packet or a data packet (step 1030). If the decoded packet is a data packet, then it is sent as a BCH result packet to node B 1090. If it is a preamble packet, then majority bit voting (step 1032) is performed on the Q copies of the preamble body, where in FIG. 8, Q=5. The bits in the same position are compared in each of the Q copies and the majority of 1's or 0's is the value of the bit in that bit position for the result preamble packet 1024. This result preamble packet is 24 symbols in length and is sent, as a BCH result packet, to node B 1090.

If there are one or more codewords with BCH uncorrectable errors, BCH flowchart 910 is then exited (step 1040) with a decoded packet with uncorrectable errors, and proceed to node A 1050 depicted in FIG. 9A.

In FIG. 9D, node A 1050, gets the decoded preamble or data packet with the uncorrectable BCH errors. A NAK is sent by the receiver 1052. The receiver then waits for retransmission (step 1054).

The transmitter re-sends the preamble or data frame, if a NAK is received. If an ACK is received then the transmitter assumes the frame was received with no uncorrectable errors. If neither a NAK or ACK is received within K seconds of the completion of the transmission of a data or preamble frame then there is a retransmission of the data or preamble frame. There are L retransmissions before the connection is terminated. In one specific embodiment K equals 3 and L equals 2.

6.3 Erasure Correction

The retransmitted frame, is processed using the method as described in the BCH flowchart 910. If a decoded packet is returned from the BCH flowchart 910, it has uncorrectable BCH errors and erasure correction is performed on it at step 1062. The original and retransmitted encoded data or preamble packets are compared on a bit-by-bit basis. Typically, the packets are either all preamble or all data packets. For any bit position where the 2 packets agree (i.e. are both "0" or both "1"), the combined packet should have the agreed bit value at that position.

For any bit position where the 2 encoded packets disagree, the appropriate codeword in the combined packet should has an erasure at that position. The erasure correction algorithm is performed on the combined packet codewords to give the erasure result codewords. If a combined codeword contains one erasure, simply replace the erasure with a "0" and BCH decode normally to give an erasure result codeword. If the correct value for the erasure is "0", the BCH decoding will indicate "No errors." If the correct value of the erasure is "1", the codeword now contains 1 error, which will be corrected by BCH decoding. For the second case, to prevent possible mis-correction, the error found by the decoder should be at the same location as the erasure. If BCH decoding has uncorrectable error, or in the second case above if the decoding gives an error location in a bit other than the erasure location, then the erasure result packet has uncorrectable errors.

If a BCH(26,21) codeword contains two erasures, the following steps are performed:

1) Replace both erasures with 0's and BCH decode normally. Call the decoded word C1.
2) Replace both erasures with 1's and BCH decode normally. Call the decoded word C2.
3) Compare C1 and C2 with the originally received codeword. Whichever one agrees with the original codeword in all non-erased bit positions is the erasure result codeword. (If one of the decoded words, e.g., C1, matches the original codeword in all non-erased bit positions and the other decoded word, e.g., C2, indicates an uncorrectable error, the erasure result codeword is in this example C1). If a BCH(26,21) codeword contains 3 or more erasures, the erasure result codeword has uncorrectable errors.

If there are any erasure result codewords with uncorrectable errors at step 1062, then the erasure result packet has uncorrectable errors and a NAK is sent by the receiver at step 1052. If the erasure correction procedure corrects the errors, then it is sent as a BCH result packet to node B at step 1090. If this is not the first retransmission at step 1058, then it is determined whether this is the second retransmission at step 1064. If it is not the second retransmission of the frame, then it is a third retransmission and the connection is terminated at step 1080. If it is the second retransmission, then the BCH flowchart 910 is executed with the interleaved frame. If the BCH flowchart 910 is exited at step 1040, then this decoded packet has uncorrectable BCH errors and a majority bit vote is performed at step 1068 using the majority bit combining.

6.4 Majority Bit Combining

The majority bit combining algorithm depends on how the previous encoded packets have been saved. One implementation is to save all the previous encoded packets.

This may take a lot of buffer space. The other implementation is to save only the combined packet at each stage. While this reduces the buffer requirements, it limits majority bit combining to a maximum of L retransmissions, where in this embodiment L=3. In a specific embodiment only the combined packet is saved at each stage; the majority bit combining algorithms is as follows:

Start by comparing the first two encoded packets on a bit-by-bit basis. For any bit position where the 2 packets disagree, the combined packet should have an erasure at that position.

Compare the encoded packets (the combined packet from the first 2 transmissions and the newly received third copy) on a bit-by-bit basis;

For any bit position where the 2 packets agree (i.e. are both "0" or both "1"), the majority bit combined packet should have the agreed bit value at that position.

For any bit position where the 2 packets disagree (i.e. one is a "1" and the other is a "0"), the majority bit combined packet should have the bit value of the combined packet (based on the first 2 copies). This is because, for this case, there have been 2 repetitions of 1 value and one of the other, so this results in a majority vote.

For any bit position where the combined packet from the first 2 transmissions has an "erasure", the majority bit combined packet should have the bit value of the newly received third copy. This will result in a majority vote.

In another embodiment where all the L encoded packets are saved, the majority bit combining algorithm is as follows:

Compare the encoded packets on a bit-by-bit basis

At each bit position, the bit value at each location should be a majority vote among the L received values of that bit. This gives the majority bit combined packet.

6.5 CRC Checking

The majority bit combined packet is again BCH decoded at step 1070. If there are still uncorrectable errors, the connection is terminated at step 1080. If the error have been corrected, then the parity bits are stripped out at step 1072 and the resulting CRC packet is tested for CRC error at step 1074. CRC error checking is similar to CRC generation. In a specific embodiment, a CRC is generated on the resulting packet, i.e., the received packet minus the CRC bits, and compared to the removed CRC bits; there are no errors in the resulting CRC packet, if there is an exact match, i.e., the "exclusive or" between the CRC generated on the resulting CRC packet and the removed CRC bits are 0's. This is done by "pppfcs32(char*cp, UINT8 len)" with len=132, and "cp" pointing to the decoded packet.

In another embodiment, the CRC is calculated for a data packet having a string of 924 bits (equivalent to 128 7-bit symbols plus 28 CRC bits). "data[0–924]" is the string of data bits. At the end of the $924^{th}$ loop, c0 through c27 contain the 28 CRC-28 check bits. If the 28 check bits are all 0's, then the resulting CRC data packet has no errors; if any check bits are 1, then an uncorrectable error has occurred in the resulting CRC data packet. For the preamble packet, data[0–168] is the string of 20 7-bit symbols having the preamble packet plus 28 CRC bits. So "i" in the loop is incremented until i<168. At the end of the $168^{th}$ loop, c0 through c27 contain the 28 CRC-28 check bits. If the 28 check bits are all 0's, then the resulting CRC packet has no errors, otherwise there is an uncorrectable error.

```
for(i=0; i<924; i++)
{temp=data[i]; c27=c26; c26=c25^temp; c25=c24;
c24=c23^temp; c23=c22^temp; c22=c21; c21=c20; c20=c19;
c19=c18; c18=c17^temp; c17=c16^temp; c16=c15^temp;
c15=c14^temp; c14=c13^temp; c13=c12;
c12=c11; c11=c10^temp; c10=c9; c9=c8; c8=c7^temp;
c7=c6; c6=c5; c5=c4; c4=c3^temp; c3=c2^temp; c2=c1;
c1=c0; c0=data[i]^temp; }
```

If there are CRC errors, the connection is terminated at step 1080. If there are no CRC errors go to node C at step 1100.

Figure 9E:
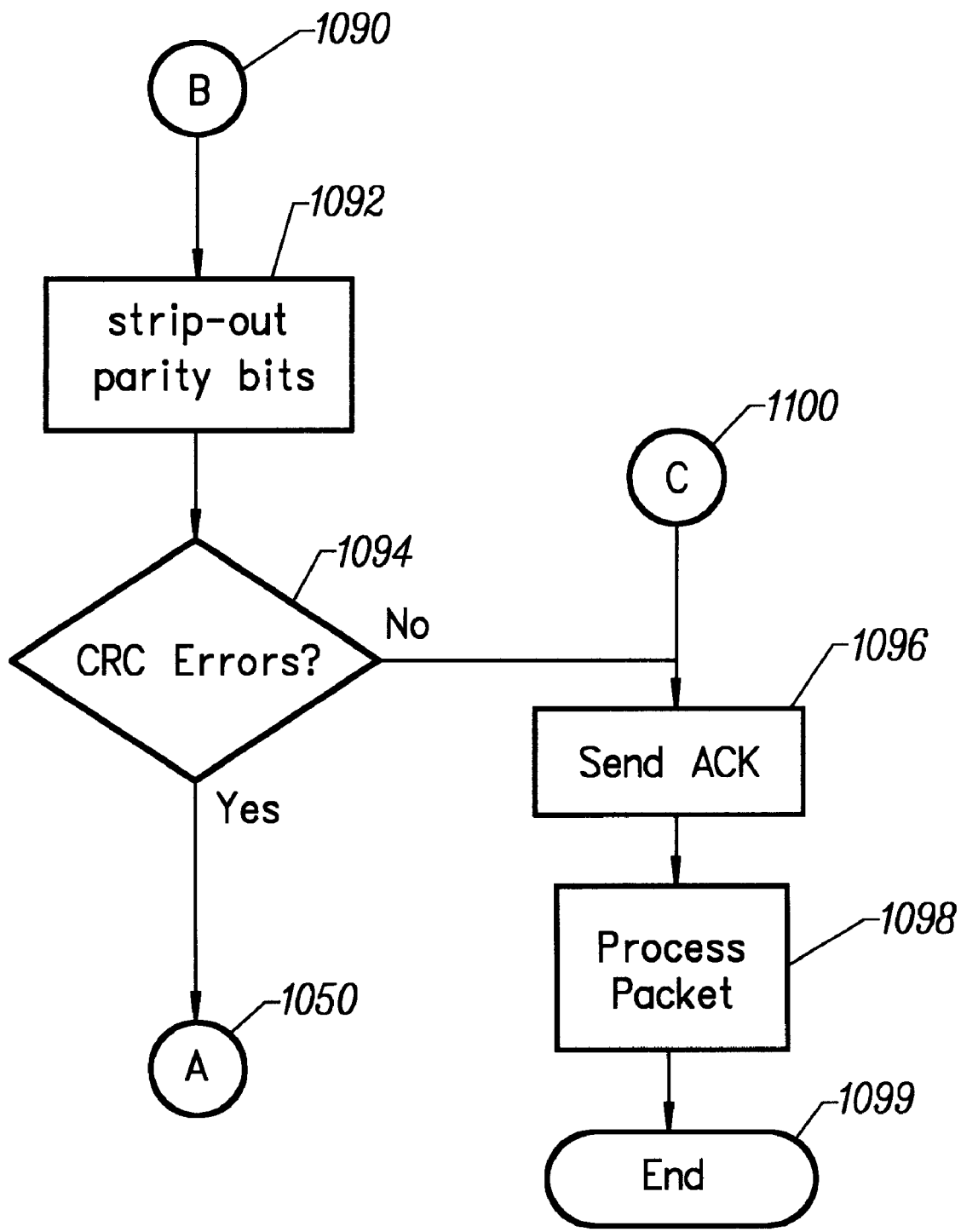

FIG. 9E starts at either node B at step 1090 or node C at step 1100. From node B a BCH result packet has its parity bits stripped out at step 1092, and it is checked for CRC errors at step 1094. If there are CRC errors then GOTO node A at step 1050 to transmit a NAK. If there are no CRC errors then an ACK is transmitted at step 1096, and the stripped packet is ready to process as an error free packet at step 1098. If it is a preamble packet, then authentication occurs. If it is a data packet, then it is assembled with other received data packets to form a session 220. The session is then divided into messages 210.

7. Conclusion

In the foregoing specification, the invention has been described with reference to specific exemplary embodiments thereof. Other embodiments will be apparent to those of ordinary skill in the art. For example, the remote device may receive data before it sends data to the messaging server. Thus, it is evident that various modifications and changes may be made thereunto without departing from the broader spirit and scope of the invention as set forth in the appended claims and their full scope of equivalents.

What is claimed is:

1. A method of communicating messages between a messaging server and a remote device comprising:

establishing a connection between the remote device and the messaging server by the remote device transmitting a preamble frame;

exchanging a data frame between the remote device and the messaging server;

detecting an error in the data frame;

correcting the error in the data frame, if the error is correctable;

re-transmitting the data frame, if the error is uncorrectable;

wherein correcting the error in the data frame comprises:

comparing a packet type code to a fixed set of packet type codes, wherein the packet type code is replaced by a member of the fixed set of packet type codes that has the smallest Hamming distance, if a Hamming distance is less than or equal to a fixed value; and indicating that the data frame has uncorrectable errors, if the Hamming distance is greater than the fixed value.

2. A method of communicating messages between a messaging server and a remote device comprising:

establishing a connection between the remote device and the messaging server by the remote device transmitting a preamble frame;

exchanging a data frame between the remote device and the messaging server;

detecting an error in the data frame;

correcting the error in the data frame, if the error is correctable;

re-transmitting the data frame, if the error is uncorrectable;

wherein correcting the error in the data frame comprises:

extracting a code word from the data frame comprising an encoded data packet;

computing a syndrome of the codeword;

looking up the syndrome in a error location look-up table to determine a bit position of a erroneous bit; and correcting the erroneous bit, if correctable.

3. A method of communicating messages between a messaging server and a remote device comprising:

establishing a connection between the remote device and the messaging server by the remote device transmitting a preamble frame;

exchanging a data frame between the remote device and the messaging server;

detecting an error in the data frame;

correcting the error in the data frame, if the error is correctable;

re-transmitting the data frame, if the error is uncorrectable;

wherein correcting the error in the data frame comprises, performing erasure correction of a retransmitted data frame, if both original and retransmitted data frames have uncorrectable errors.

4. The method of claim 3, wherein correcting the error in the data frame further comprises, performing majority bit combining and BCH decoding, if there are at least two retransmissions of data frames and both the retransmitted data frames and original data frame have uncorrectable errors.

5. A method of communicating messages between a messaging server and a remote device comprising:

establishing a connection between the remote device and the messaging server by the remote device transmitting a preamble frame;

exchanging a data frame between the remote device and the messaging server;

detecting an error in the data frame;

correcting the error in the data frame, if the error is correctable;

re-transmitting the data frame, if the error is uncorrectable;

wherein correcting the error in the data frame comprises:

extracting a decoded data packet from the data frame;

performing a CRC check on the decoded data packet, wherein the decoded data packet has correctable errors and has parity bits removed; and indicating that an uncorrectable error has occurred, if CRC check bits are not all zero.

6. A method of communicating messages between a messaging server and a remote device comprising:

establishing a connection between the remote device and the messaging server by the remote device transmitting a preamble frame;

detecting an error in the preamble frame;

correcting the error in the preamble frame, if the error is correctable;

re-transmitting the preamble frame, if the error is uncorrectable;

exchanging a data frame between the remote device and the messaging server;

detecting an error in the data frame;

correcting the error in the data frame, if the error is correctable; and re-transmitting the data frame, if the error is uncorrectable.

7. The method of claim 6, further comprising, comparing corresponding bits of each of a plurality of copies of a preamble body in the preamble frame, wherein the copies of the preamble body are in the preamble frame, to select a bit value that is present in more than half of the copies, and forming a result preamble packet.

8. The method of claim 7, further comprising:

performing a CRC check on the result preamble packet wherein the parity bits have been removed; and indicating that an uncorrectable error has occurred if the CRC check bits are not all zero.

9. The method of claim 6, wherein correcting an error in the preamble frame comprises:

extracting a codeword from a preamble frame comprising an encoded preamble packet;

computing a syndrome of the codeword;

looking up the syndrome in a error location hold-up table for determining the bit position of an erroneous bit;

correcting the erroneous bit, if correctable; and indicating the preamble frame has an uncorrectable error, if an error is uncorrectable.

10. The method of claim 6, wherein the correcting an error in the preamble frame comprises performing erasure correction of the retransmitted preamble frame, if both original and retransmitted preamble frames have uncorrectable errors.

11. A method for error detection and correction during a data exchange between a messaging server and a remote device comprising:

analyzing a data packet type for errors;

decoding an encoded data packet wherein the decoding is BCH decoding;

performing erasure correction, if an original and retransmitted decoded data packets have uncorrectable errors;

performing majority bit combining and BCH decoding, if there are at least two retransmissions and the original and both retransmitted decoded data packets have uncorrectable errors;

analyzing CRC check bits on the result packets wherein parity bits have been removed; and sending ACK, if the errors can be corrected.

12. A method of communicating messages over a telephone network between a messaging server and a remote device comprising:

establishing a connection between the remote device and the messaging server, wherein the establishing comprises:
  transmitting a preamble frame from the remote device to the messaging server, wherein the preamble frame comprises multiple copies of a preamble body;
  analyzing the preamble frame for preamble errors, wherein the preamble errors are preamble forward error detected and corrected;
  retransmitting the preamble frame, if the preamble errors are uncorrectable; and
  transmitting a preamble acknowledgment frame, if the preamble frame has no uncorrectable preamble errors;
transmitting a series of remote device data frames from the remote device to the messaging server;
analyzing the series of remote device data frames for remote device data errors, wherein the errors are data forward error detected and corrected, and the remote device data frames are retransmitted, if the errors are uncorrectable;
transmitting to the remote device a series of remote device acknowledgment frames, if the remote device frames have no uncorrectable remote device data errors;
transmitting from the remote device to the messaging server a ready frame indicating that the remote device is ready to receive data;
transmitting a series of messaging server data frames from the messaging server to the remote device;
analyzing the messaging server data frames for server data errors, wherein the server data errors are data forward error detected and corrected, and retransmitting the messaging server data frames, if the server data errors are uncorrectable; and
transmitting to the messaging server a series of messaging server acknowledgment frames, if the messaging server data frames have no uncorrectable server data errors.

13. The method of claim 12, further comprising:
dialing into the messaging server by a user;
sending a messaging server audible voice greeting to the user; and
initiating sending of the preamble frame by the user pressing a send button on the remote device.

14. The method of claim 13, wherein the audible voice greeting may be transferred simultaneously with the user pressing the send button in the remote device.

15. The method of claim 12, wherein the data frames comprise data packets of fixed length.

16. The method of claim 12, further comprises creating a session comprising a plurality of messages.

17. The method of claim 16, wherein the session may be divided into a series of data packets of fixed length.

18. The method of claim 16, wherein the message comprises a series of fields, each field separated by a delimiter.

19. The method of claim 18, wherein the delimiter comprises a control character.

20. The method of claim 16, wherein the message comprises a sender field and a primary recipient field.

21. The method of claim 20, further comprising a message time stamp field comprising a month field, a day of month field, a hour field, and a minute field.

22. The method of claim 20, further comprising a compressed message body.

23. The method of claim 20, further comprising a message identification field.

24. A computer program product for communicating messages over a telephone network between a messaging server and a remote device comprising:
  code for establishing a connection between the remote device and the messaging server, wherein the establishing comprises:
  code for transmitting a preamble frame from remote device to the messaging server, wherein the preamble frame comprises multiple copies of the preamble body;
  code for analyzing the preamble frame for errors, wherein the errors are preamble forward error detected and corrected;
  code for retransmitting the preamble frame, if the errors are uncorrectable; and
  code for transmitting a preamble acknowledgment frame, if the preamble frame has no uncorrectable errors;
  code for transmitting a series of remote device data frames from the remote device to the messaging server;
  code for analyzing the remote device data frames for errors, wherein the errors are data forward error detected and corrected, and the remote device data frames are retransmitted, if the errors are uncorrectable;
  code for transmitting to the remote device a series of remote device acknowledgment frames, if the remote device frames have no uncorrectable errors;
  code for transmitting from the remote device to the messaging server a ready frame indicating that the remote device is ready to receive data;
  code for transmitting a series of messaging server data frames from the messaging server to the remote device;
  code for analyzing the messaging server data frames for errors, wherein the errors are data forward error detected and corrected, and the messaging server data frames are retransmitted, if the errors are uncorrectable;
  code for transmitting to the messaging server a series of messaging server acknowledgment frames, if the messaging server data frames have no uncorrectable errors; and
a computer readable storage medium for holding the codes.

* * * * *